US008312410B2

(12) United States Patent
Foster et al.

(10) Patent No.: US 8,312,410 B2
(45) Date of Patent: Nov. 13, 2012

(54) PARAMETERIZED CELL CACHING IN ELECTRONIC DESIGN AUTOMATION

(75) Inventors: William K. Foster, Saratoga, CA (US); Scott I. Chase, Pleasanton, CA (US)

(73) Assignee: Synopsys, Inc., Mountain View, CA (US)

( * ) Notice: Subject to any disclaimer, the term of this patent is extended or adjusted under 35 U.S.C. 154(b) by 305 days.

(21) Appl. No.: 12/718,850

(22) Filed: Mar. 5, 2010

(65) Prior Publication Data

US 2011/0219349 A1  Sep. 8, 2011

(51) Int. Cl.
*G06F 17/50* (2006.01)
*G06F 11/22* (2006.01)
*G06F 15/04* (2006.01)
(52) U.S. Cl. .................. 716/136; 716/125; 716/139
(58) Field of Classification Search .......... 716/125, 716/136, 139
See application file for complete search history.

(56) References Cited

U.S. PATENT DOCUMENTS

| 7,546,556 | B1 * | 6/2009 | Wagner ............... 716/110 |
| 7,698,662 | B1 * | 4/2010 | Wu et al. ............ 716/104 |
| 7,761,829 | B1 * | 7/2010 | Jayachandran et al. ...... 716/130 |
| 7,949,987 | B1 * | 5/2011 | Ginetti et al. ............ 716/139 |
| 2005/0060128 | A1 * | 3/2005 | Reed et al. ............... 703/1 |
| 2005/0102644 | A1 * | 5/2005 | Collins et al. ............ 716/11 |
| 2010/0115207 | A1 * | 5/2010 | Arora et al. ............. 711/144 |
| 2011/0061034 | A1 * | 3/2011 | Ginetti et al. ............ 716/104 |

* cited by examiner

*Primary Examiner* — Vuthe Siek
*Assistant Examiner* — Magid Dimyan
(74) *Attorney, Agent, or Firm* — Park, Vaughan, Fleming & Dowler LLP; Laxman Sahasrabuddhe

(57) ABSTRACT

Some embodiments provide a system that improves performance during parameterized cell instantiation in an electronic design automation (EDA) application. During operation, the system persists evaluation results associated with a parameterized cell in the design within a session of the EDA application so that the evaluation results are available even after they have been flushed from memory. Further, the system can persist the evaluation results across sessions of the EDA application. Next, the system uses the persisted evaluation results to instantiate the parameterized cell without re-evaluating the parameterized cell. Finally, the system discards the persisted evaluation results based at least on a dependency associated with the parameterized cell.

16 Claims, 6 Drawing Sheets

PARAMETERIZED CELL CACHING IN ELECTRONIC DESIGN AUTOMATION

BACKGROUND

1. Technical Field

This disclosure relates to electronic design automation (EDA). More specifically, this disclosure relates to parameterized cell caching in EDA applications.

2. Related Art

Electronic design automation (EDA) tools allow for the hierarchical design of integrated circuits, in which portions of large designs may be divided into manageable subsections which can be worked on independently by designers. Specifically, an EDA tool can create and manipulate a design using OpenAccess which defines a standardized data model and interface for representing and accessing the design.

A parameterized cell (pcell) allows a designer to create a design that can be adapted to a particular situation based on a set of parameters. Specifically, a designer can provide zero or more parameter values to a pcell during instantiation. If a parameter value is not provided to the pcell, a default value for that parameter is used. Next, the source code of the pcell is executed which uses the supplied and/or default parameter values to generate the customized instance of the pcell.

Today's circuit designs can include a large number of pcell instances. It is computationally inefficient to execute the source code of the pcell every time a cell instance is created. Hence, what is needed are systems and techniques for improving efficiency of EDA applications which use pcells.

SUMMARY

Some embodiments provide systems and techniques for improving performance and usability of EDA applications which use pcells. During operation, the system persists evaluation results of a pcell within a session of the EDA application so that the evaluation results are available even after they have been flushed from memory. Further, the system can persist the evaluation results across sessions of the EDA application. Next, the system uses the persisted evaluation results to instantiate the pcell without re-evaluating the pcell. The system maintains a set of dependencies for each pcell. If the system detects a change based on the set of dependencies, the system discards the persisted evaluation results. The system may then re-evaluate the pcell and persist the new evaluation results.

There are many advantages to persisting pcell evaluation results. First, it improves performance of the EDA application because the EDA application does not need to evaluate a pcell if a valid evaluation result is available. Second, it can enable an EDA application to use a pcell when an evaluator is not available (e.g., when a library is delivered to a customer who does not have access to the pcell evaluator). Third, it can be used for "freezing" pcells by forcing the EDA application to use the persisted evaluation results even if they are invalid. This can be useful when the set of dependencies are changing frequently (e.g., due to frequent changes to the technology data) and the design team wants to isolate the workflow from the frequent changes until the design team is in a position to absorb the impact on the workflow from such frequent changes.

The dependency can be associated with a timestamp, a file path, and/or an evaluation result of a dependency-checking expression for the pcell. Specifically, the system can discard the persisted evaluation results if one or more of the following changes are detected: a change in the timestamp of a file which contains the source code of the pcell, a change in the version of a pcell evaluator, and/or a change in the evaluation result of a dependency-checking expression associated with the pcell. The dependency-checking expression can capture dependencies which are not detectable based on the properties of a file or more precisely on a portion of a file to avoid false dependency change detections. For example, the source code of the pcell can use one or more constraints (e.g., minimum distance between two shapes) which are not provided as parameters to the pcell when the pcell is instantiated, but which are stored together with many other constraints whose value changing should not require a reevaluation of the pcell. A designer can register dependency-checking expressions for the pcell which return the values of such constraints. If the system detects a change in the evaluation result of the dependency-expression, the system can conclude that the persisted evaluation results are invalid, and discard the evaluation results.

In some embodiments, a pcell (e.g., a super-master in OpenAccess) includes the source code for the pcell and default values for a set of parameters. A variant of a pcell (e.g., a sub-master in OpenAccess) is a pcell instantiation which uses a particular set of supplied and/or default parameter values. The system persists the evaluation results of a variant by: executing the source code of the pcell using the parameter values associated with the variant, and storing the evaluation results (e.g., a sub-master) at a location in a cache file. Next, the system can map the variant to the location in the cache file. To map the variant to the location in the cache file for subsequent cache access, the system may serialize the set of parameter values for the variant into a unique symbol and map the unique symbol to an offset corresponding to the location in the cache file. For example, the system can map the unique symbol to the location information provided by an OpenAccess interface for storing sub-masters.

In some embodiments, the evaluation result of the variant is persisted across sessions of the EDA application by storing the mapping of the variant to the location in a cache file in an index file. In some embodiments, the persisted evaluation results can be discarded based at least on a file size threshold associated with the cache file and/or index file. Specifically, if the cache file or the index file becomes too large, the system can decide to flush the cache file and index file and start all over again.

Cache entries can be invalidated at an arbitrary level of granularity. For example, upon detecting a change in a dependency (e.g., a change in the default value of a parameter), the system may invalidate only those cache entries which are affected (e.g., the cache entries that correspond to sub-masters that used the old default values). Alternatively, for other kinds of dependencies (e.g., a broader-reaching dependency), the system may flush the entire cache whenever a change in a dependency is detected.

To instantiate a pcell using the persisted evaluation results, the system may transparently intercept an evaluation request for the pcell. The system may then process the evaluation request based on the presence of an evaluation result corresponding to the evaluation request in the cache file. The system can use the set of parameter values to generate a symbol, and use the symbol to lookup an evaluation result in the cache file. The system may instantiate the pcell from the cache file if the cache file contains the evaluation result. On the other hand, the system may pass the evaluation request to the evaluator for the pcell that was transparently intercepted if the evaluation result is not found in the cache file.

In some embodiments, transparent interception of the evaluation request is enabled by registering an interposing evaluator in an interposition directory inserted at the start of the evaluator search path. An evaluator can be implemented as an interchangeable plug-in an EDA application. A plug-in can support one or more pcell description languages (e.g., Tcl, Python, C++, etc.), and the system can load or select the appropriate plug-in at pcell evaluation time. If the OpenAccess system attempts to load a plug-in for a pcell evaluator and a same named interposing evaluator is located in the interposition directory, the attempt to load the plug-in is intercepted and the interposing evaluator is loaded. The interposing evaluator first checks the cache for evaluation results. In case of a cache miss, the interposing evaluator passes the evaluation request to the original plug-in that was transparently intercepted.

In some embodiments, the name of the interposing pcell evaluator matches the name of the actual pcell evaluator. For example, if the Tcl pcell evaluator is called "tcl_evaluator," then the interposing evaluator is additionally registered using exactly the same name, i.e., "tcl_evaluator." Since the interposing evaluator is registered at the top of the plug-in search path, the system will load the interposing evaluator instead of the actual evaluator. If multiple pcell evaluators exist in the system (e.g., pcell evaluators for Tcl, Python, etc.), then the interposer evaluator may need to be registered multiple times to intercept the different evaluators. For example, the interposer evaluator may be registered under different names (e.g., "tcl_evaluator," "python_evaluator," etc.) to intercept different pcell evaluators.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), Blu-ray Discs, or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
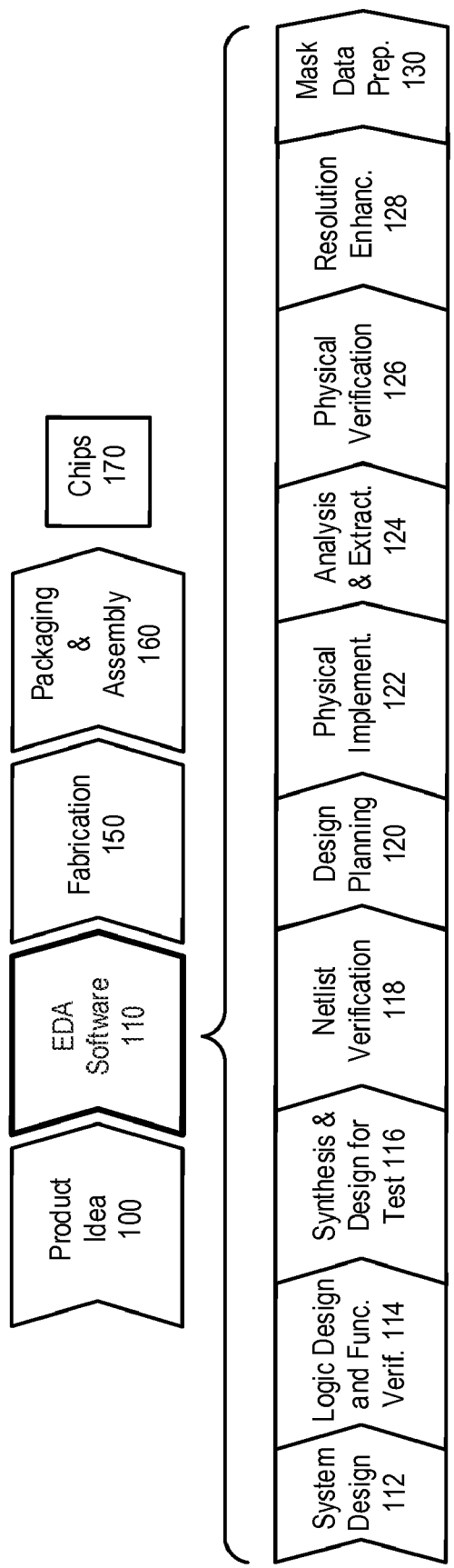
FIG. 1 shows a workflow associated with the design and fabrication of an integrated circuit in accordance with an embodiment.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a design can be created using a Hardware Description Language (HDL) and checked for functional accuracy.

In the synthesis and design step 116, the HDL code can be translated to a netlist, which can be optimized for the target technology. Further, in this step, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to ensure correctness for manufacturing, electrical issues, lithographic issues, and circuitry.

In the resolution enhancement step 128, geometric manipulations can be performed on the layout to improve manufacturability of the design. Finally, in the mask data preparation step 130, the design can be taped-out for production of masks to produce finished chips.

Embodiments of the present invention can be used in one or more of the above-described steps.

Figure 2:
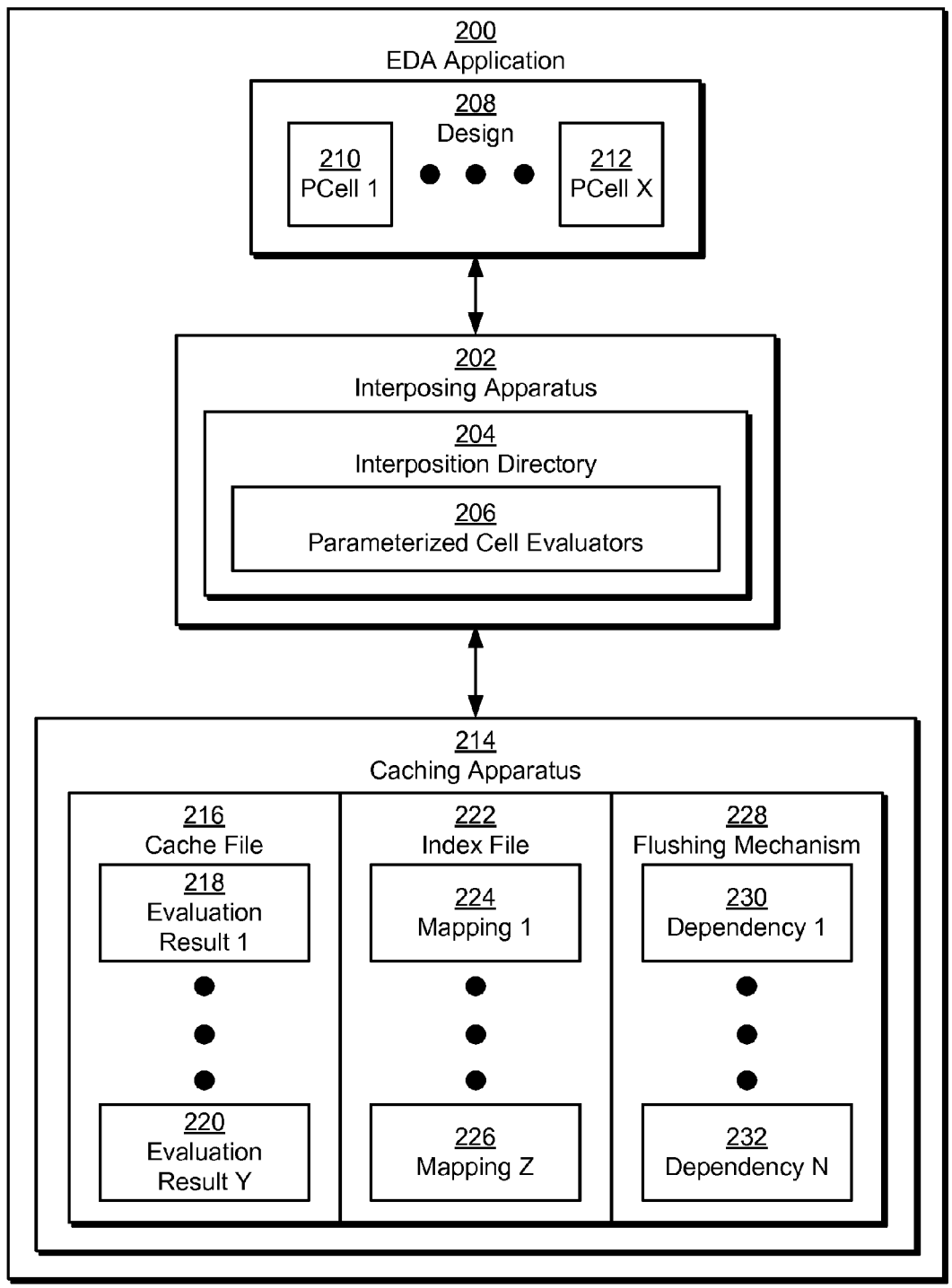
FIG. 2 shows an electronic design automation (EDA) application in accordance with an embodiment.

FIG. 2 shows an EDA application 200 in accordance with an embodiment. As shown in FIG. 2, EDA application 200 includes an interposing apparatus 202, a design 208, and a caching apparatus 214. Each of these components is described in further detail below.

Design 208 may correspond to an abstract representation of an integrated circuit that uses graphical objects to represent components in the integrated circuit. For example, design 208 may correspond to an OpenAccess design, such as a schematic, or a layout. Design 208 may contain symbols that represent resistors, capacitors, transistors, logic gates, and/or other components in the integrated circuit. The graphical objects may additionally be connected by lines that represent power, ground, and/or signal connections between the components. In other words, the functionality of the integrated circuit may be illustrated by the components and interconnections within design 208.

Design 208 may be created using EDA application 200. For example, EDA application 200 may correspond to a schematic editor that allows a user to create design 208 on a computer system. Moreover, EDA application 200 may allow design 208 to be created hierarchically. In particular, design 208 may include a hierarchy of cells which themselves may instantiate other designs.

Changes to a cell master may be propagated to each cell instance of the master in design 208. For example, a transistor and a gate may be designed as masters at the bottom of the hierarchy. A master of an inverter may then be created from the transistor and gate at the next level of the hierarchy, and a master of a buffer may be created from two inverters at the level above that of the inverter's. Changes to the master of the transistor may thus be propagated to cell instances of the transistor within the inverter, buffer, and/or other cells containing the transistor.

Parameterized cells (e.g., pcell 1 210, pcell x 212) may further facilitate the centralized creation and/or reuse of components in design 208. Each pcell may be associated with a set of parameters that affect the instantiation of the pcell. A pcell, e.g., a super-master in OpenAccess, includes source code for generating an instance of the pcell (e.g. a sub-master in OpenAccess), as well as a set of default parameter values for the pcell's parameters. To instantiate the pcell within design 208, the source code for the pcell may be executed by a pcell evaluator using the parameters of that pcell instantiation. For example, a plug-in corresponding to a C++ pcell evaluator may be used to instantiate pcells from super-masters that are written in C++, while a separate plug-in implementing a Tcl pcell evaluator may be used to instantiate pcells from Tcl super-masters.

Variants of a pcell (e.g., sub-masters in OpenAccess) correspond to instantiations of the pcell using different sets of parameter values. For example, a pcell for a transistor may include parameters for the transistor's width, length, and/or the shapes of the polygons. The transistor's pcell may include a default width of 4 units, a default length of 1 unit, and a default number of fingers of 1 (some transistor layouts include a shape that has multiple projections which are often referred to as "fingers"). The transistor may also include two variants with different parameter values; the first variant may include a width of 4 units, a length of 1 unit, and two fingers, and the second variant may have a width of 6 units, a length of 2.5 units, and one finger.

Because computational resources may be consumed during pcell evaluation (e.g., executing source code for the pcell), evaluation results for variants of the pcell may be cached for future instantiation of the pcell in lieu of repeated evaluation of the pcell. For example, caching apparatus 214 and interposing apparatus 202 may provide in-memory caching of OpenAccess pcells, in which each variant in design 208 is evaluated once per session of EDA application 200 and cached for reuse during the session. Note that the user may open and close a design or a super-master multiple times within the same session. In conventional approaches, each time a user closes a design or a super-master, the evaluation results are flushed from memory. In contrast, caching apparatus 214 can persist evaluation results (e.g., by storing them on disk) within a session of the EDA application so that the evaluation results are available even after they have been flushed from memory (e.g., when a user closes a design or a super-master). However, per-session evaluations of variants in design 208 may still affect computational performance in a noticeable way. For example, the opening of a large integrated circuit design may incur significant computational overhead and/or delay within EDA application 200 by requiring the individual evaluation of millions of variants before the design may be viewed and/or modified by the user.

In one or more embodiments, caching apparatus 214 includes functionality to persist evaluation results associated with pcells in design 208 across sessions of EDA application 200. In particular, caching apparatus 214 may maintain a cache file 216 of evaluation results (e.g., evaluation result 1 218, evaluation result y 220) of variants of a pcell. In some embodiments, the system uses one cache file per pcell. In these embodiments, all the variants of the pcell are stored in the cache file for that pcell. Each variant's evaluation result may be stored at a particular location in cache file 216, with newer evaluation results written at higher offsets than older evaluation results. Note that embodiments of the present invention are not limited to a particular order for storing the evaluation results. For example, in some embodiments, newer evaluation results may be written at lower offsets than older evaluation results. Cache file 216 may additionally contain an evaluation result of the pcell with default values if an instance of the pcell is used in design 208 with default values. In particular, for each parameter, if a value is provided, then the provided value is used, otherwise, the default value is used. Note that a variant in which a parameter is not provided (i.e. it is defaulted) and a variant in which the default value is explicitly provided are treated as different variants even though the evaluation result would be the same for both variants. In some embodiments, the two variants may be treated the same way, i.e., the system may use a single variant for both situations. However, in such embodiments, the cache entry associated with the variant may need to be invalidated more often.

Moreover, caching apparatus 214 may maintain an index file 222 containing a mapping (e.g., mapping 1 224, mapping z 226) of each variant to the location of the variant's evaluation results in cache file 216. In other words, index file 222 may allow the current evaluation result for a given variant to be located in cache file 216 and used in instantiating the pcell without the overhead of evaluating the pcell source code. Cache file 216 and index file 222 may be written to non-volatile storage to persist the evaluation results beyond the termination of EDA application 200. For example, caching apparatus 214 may periodically write in-memory representations of cache file 216 and index file 222 to disk during the creation of design 208 within EDA application 200. Cache file 216 and index file 222 are discussed in further detail below with respect to FIG. 3.

To enable use of the persisted evaluation results in instantiating the pcell, interposing apparatus 202 may transparently intercept evaluation requests for pcells to one or more pcell evaluators 206. In one or more embodiments, interposing apparatus 202 corresponds to a plug-in in EDA application 200. To use interposing apparatus 202, plug-ins corresponding to pcell evaluators 206 may be registered in interposition directory 204. If the system attempts to load a plug-in for a pcell evaluator, interposing apparatus 202 may be loaded instead which then may itself load the original interposed evaluator for its own use during cache miss.

To respond to the evaluation request, interposing apparatus 202 may examine the contents of cache file 216 and/or index file 222 for an evaluation result that matches the evaluation request. Interposing apparatus 202 may then instantiate the pcell from cache file 216 if the evaluation result is found in cache file 216. If the evaluation result is not found in cache file 216, interposing apparatus 202 may identify the original pcell evaluator targeted by the evaluation request and pass the evaluation request to the original pcell evaluator.

The contents of cache file 216 and/or index file 222 may also be periodically discarded to ensure the validity of the evaluation results. In one or more embodiments, a flushing mechanism 228 in caching apparatus 214 discards the persisted evaluation results in cache file 216 based at least on a dependency (e.g., dependency 1 230, dependency n 232) associated with the pcell. In other words, the discarding of evaluation results in cache file 216 may be based on one or more factors that represent the dependency. The dependency may correspond to a file and/or function or constraint rule used to generate an evaluation result. For example, flushing mechanism 228 may check timestamps, file paths, pcell evaluator versions, expression values, and/or function return values to ensure that one or more files, pcell evaluators, and/or constraint values (e.g., the minimum distance between two shapes) used to generate the evaluation result have not changed since the most recent caching of the evaluation result in cache file 216. Flushing mechanism 228 may turn off dependency checking if the pcells have been "frozen" to isolate the workflow from frequent changes in the set of dependencies. Flushing mechanism 228 and dependencies associated with cache file 216 are discussed in further detail below with respect to FIG. 4.

Figure 3:
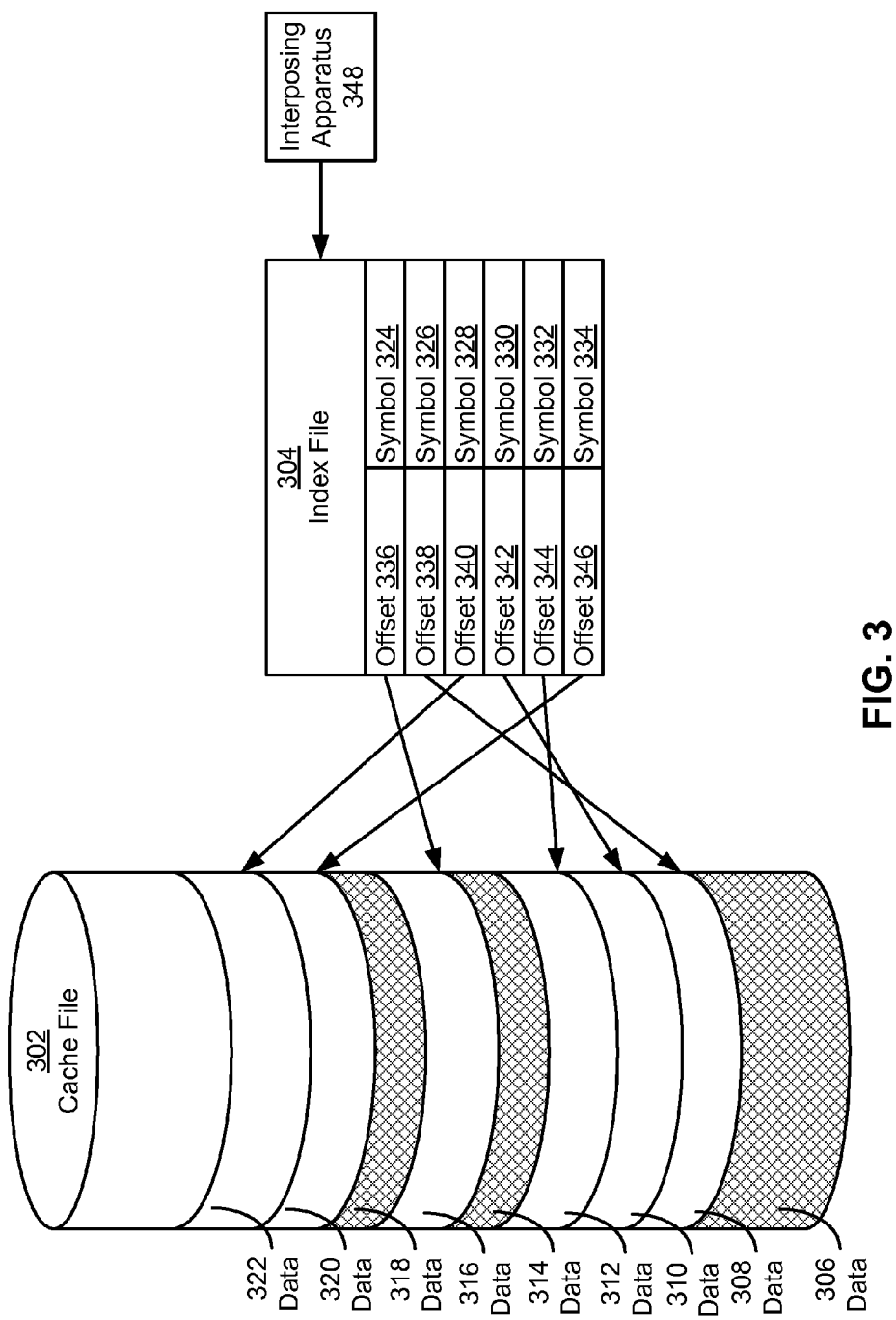
FIG. 3 shows an exemplary use of a cache file and an index file in accordance with an embodiment.

FIG. 3 shows an exemplary use of a cache file 302 and an index file 304 in accordance with an embodiment. As described above, cache file 302 and index file 304 may be created and/or maintained by a caching apparatus, such as caching apparatus 214 of FIG. 2. As shown in FIG. 3, cache file 302 includes multiple sets of data 306-322, while index file 304 contains mappings from a set of symbols 324-334 to a set of offsets 336-346 for data 306-322.

In one or more embodiments, cache file 302 stores evaluation results for variants of a pcell in an integrated circuit design, such as design 208 of FIG. 2. Each variant may correspond to a different set of parameter values for the pcell. The evaluation results may be written to cache file 302 in a bottom-up fashion. For example, data 306 may contain the oldest evaluation results for the pcell, while data 322 may contain the newest evaluation results. Additional pcell evaluation results may be written to cache file 302 between data 322 and the top of cache file 302 until cache file 302 is full and/or flushed.

In one or more embodiments, index file 304 is used to locate the evaluation results for variants of the pcell. As shown in FIG. 3, index file 304 contains six entries. Each entry may contain a mapping of a variant to a location in cache file 302 containing the newest evaluation result for the variant. Index file 304 may thus indicate that cache file 302 contains usable evaluation results for six variants of the pcell.

To add an entry to index file 304 (e.g., upon writing an evaluation result for a variant to cache file 302), a set of parameter values for the variant may be serialized into a unique symbol 324-334. For example, the unique symbol may be generated by sorting the parameter names for the pcell into alphabetical order, then concatenating parameter values for the sorted parameter names into one long string. Alternatively, the unique symbol may be generated by assigning an integer key to each unique set of parameter values, by applying a hash function to the parameter values, and/or processing the parameter values using other mechanisms.

The unique symbol may then be mapped to an offset 336-346 corresponding to the location of the evaluation result for that symbol's corresponding variant in cache file 302. For example, index file 304 may indicate that data 316 contains an evaluation result for the variant represented by symbol 324, data 308 contains an evaluation result for the variant represented by symbol 326, and data 322 contains an evaluation result for the variant represented by symbol 328. Along the same lines, data 310 may contain an evaluation result for the variant represented by symbol 330, data 312 may contain an evaluation result for the variant represented by symbol 332, and data 320 may contain an evaluation result for the variant represented by symbol 334.

Moreover, a newer evaluation result for a variant may be written above an older evaluation result in cache file 302 and used to instantiate the variant in lieu of the older evaluation result. For example, data 306, 314, and 318 may contain older evaluation results that are no longer used to instantiate variants of the pcell, while data 308-312, 316, and 320-322 may correspond to evaluation results that are generated using the most recent source code and/or technology constraints for the pcell. To enable use of the newer evaluation result in instantiating the variant, the entry for the variant in index file 304 may be updated with the offset of the newer evaluation result. For example, an older evaluation result in data 306 for the variant represented by symbol 330 may be replaced by a newer evaluation result in data 310. To reflect the newer evaluation result, offset 342 may replace an offset in data 306 in the fourth entry of index file 304.

As mentioned previously, the pcell may be instantiated using the persisted evaluation results in cache file 302 without re-evaluating the pcell. In particular, interposing apparatus 348 may transparently intercept an evaluation request for the pcell. Interposing apparatus 348 may then check index file 304 for an entry (e.g., unique symbol) that matches the set of parameter values associated with the evaluation request. If the entry exists and is valid, interposing apparatus 348 may instantiate the pcell using an evaluation result located at the offset in cache file 302 referenced by the entry. On the other hand, if the entry does not exist or is invalid due to a dependency change, interposing apparatus 348 may pass the evaluation request to the original evaluator for the pcell. The evaluation result generated using the original evaluator may then be used to instantiate the pcell. In addition, a caching apparatus (e.g., caching apparatus 214 of FIG. 2) may enable subsequent use of the evaluation result by writing the evaluation result to cache file 302 and adding an entry that associates the current evaluation's unique symbol with the evaluation result's offset within the cache file 302 to the index file 304.

Figure 4:
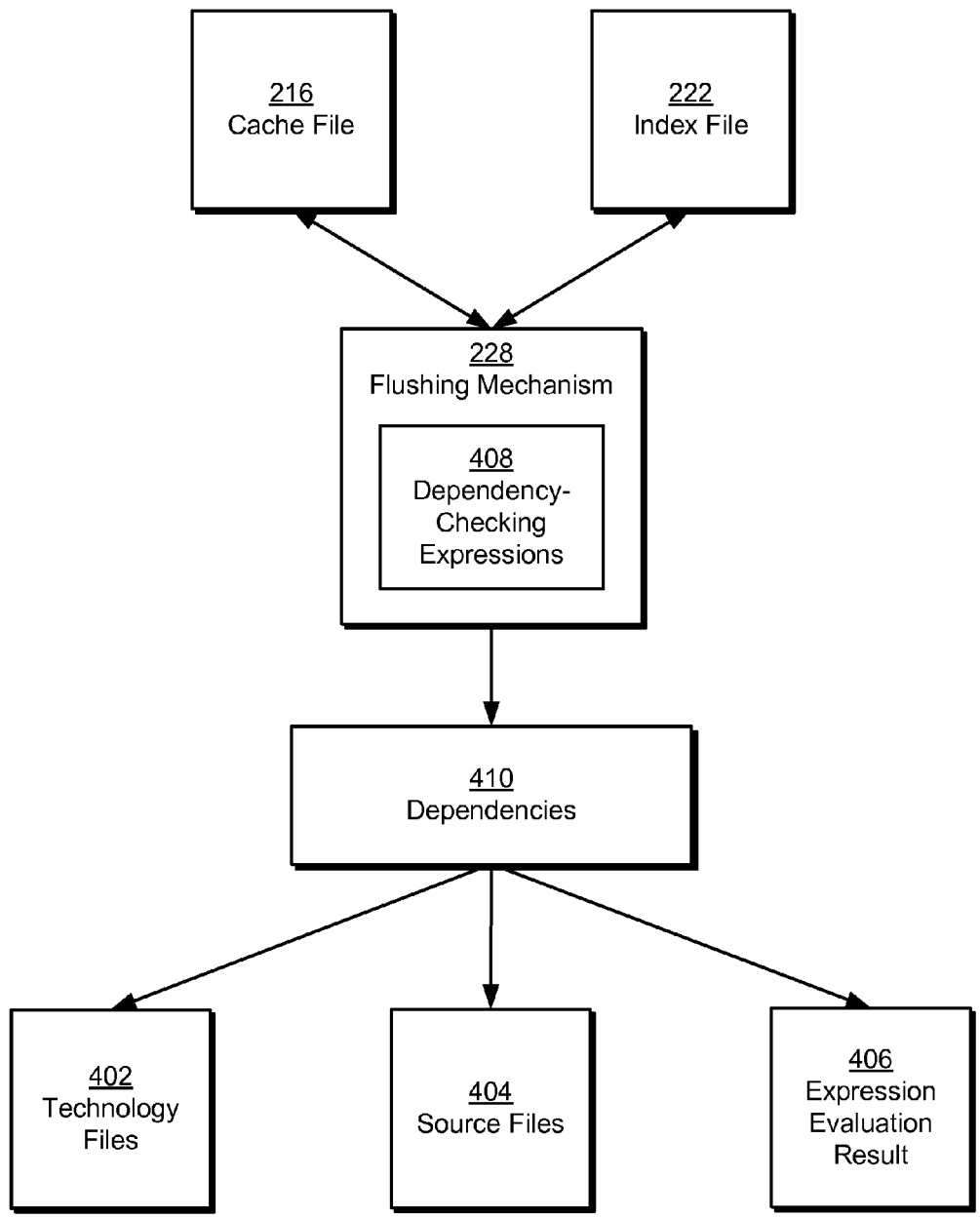
FIG. 4 shows an exemplary checking of dependencies for a pcell by a flushing mechanism in accordance with an embodiment.

FIG. 4 shows an exemplary checking of dependencies 410 for a pcell by flushing mechanism 228 in accordance with an embodiment. Dependencies determine when cache entries should be treated as invalid. Dependencies 410 may be found in technology files 402, source files 404, and/or expression evaluation result 406 associated with the pcell. For example, dependencies 410 may correspond to timestamps of technology files 402 and/or source files 404 used in the evaluation of the pcell, as well as expressions related to information used during pcell evaluation. A dependency may also correspond to the version of the interposer pcell evaluator or an original pcell evaluator which was transparently intercepted (e.g., a Tcl pcell evaluator). Further, a dependency may represent there being no inconsistency between an index file and a cache file (i.e., if an inconsistency between the index file and the cache file is detected, the dependency triggers a cache flush).

In one or more embodiments, flushing mechanism 228 uses dependency-checking expressions 408 to analyze dependencies 410. Dependency-checking expressions 408 may be included in the index file or other metadata associated with the pcell. Dependency-checking may be performed upon opening a design (e.g., design 208 of FIG. 2) containing a pcell, upon using cache file 216 to instantiate the pcell, and/or periodically during the use of the design.

Dependency-checking expressions 408 may be used to detect changes in conditions associated with the evaluation of a pcell that are independent of the parameter values for the pcell. In particular, an evaluation result of dependency-checking expressions 408 may be compared with previous evaluation results to determine if dependencies 410 have changed.

For example, dependency-checking expressions 408 may examine technology files 402 for a technology parameter corresponding to the minimum spacing between shapes. If the minimum spacing is unchanged since a particular cache file entry for a pcell was created, the dependencies are satisfied and the pcell may continue to be instantiated using the cache file entry. On the other hand, if the minimum spacing is different, flushing mechanism 228 may discard one or more entries in cache file 216 and/or index file 222 to prevent instantiation of the pcell from invalid evaluation results in cache file 216.

Flushing mechanism 228 may also flush cache file 216 and/or index file 222 independently of dependencies 410. For example, flushing mechanism 228 may discard evaluation results in cache file 216 based at least on a file size threshold associated with cache file 216. In other words, flushing mechanism 228 may flush cache file 216 after the size of cache file 216 exceeds the file size threshold. Similarly, flushing mechanism 228 may discard the contents of cache file 216 upon receiving a user request to flush cache file 216.

Figure 5:
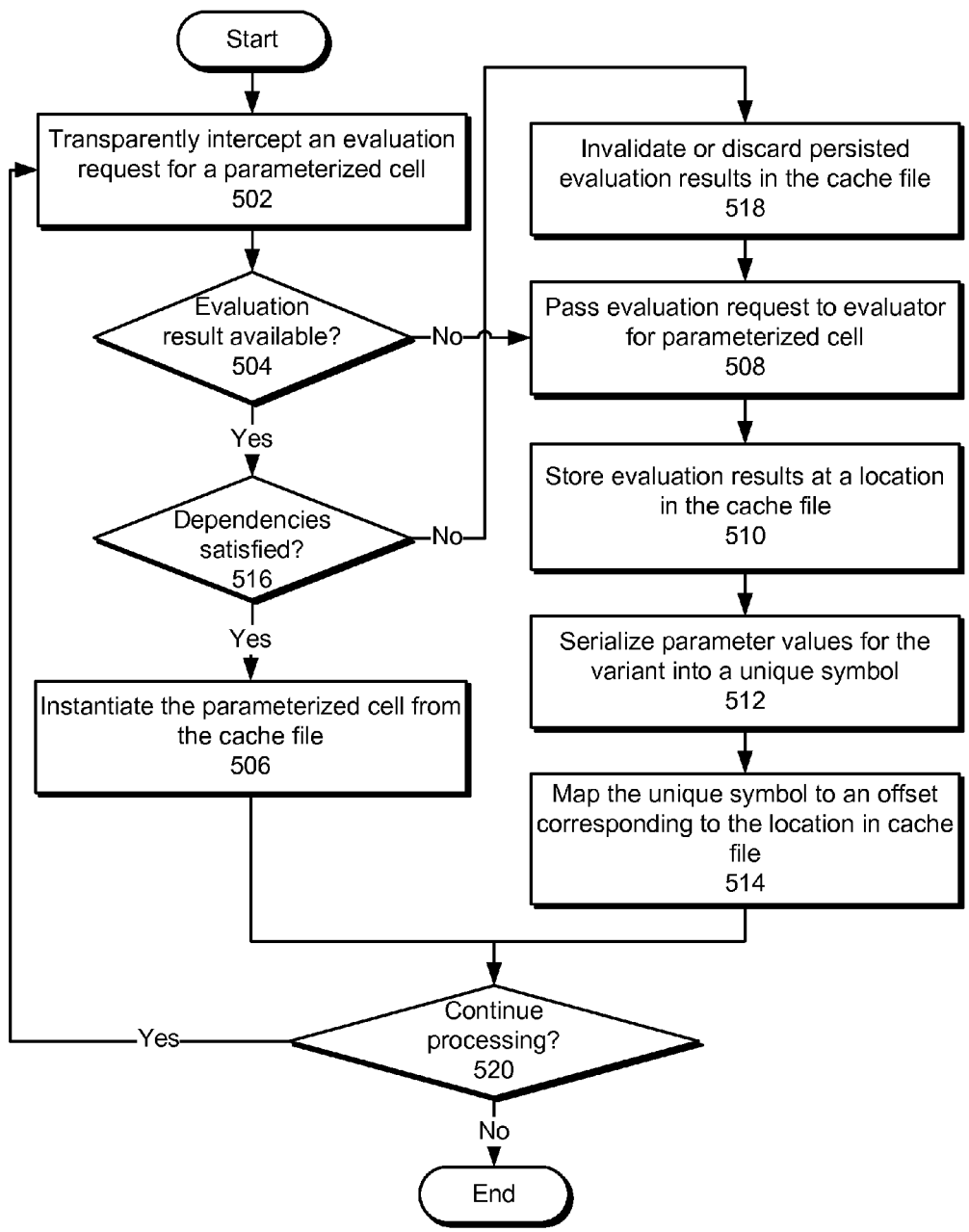
FIG. 5 shows a flowchart illustrating the process of instantiating a pcell in an EDA application in accordance with an embodiment.

FIG. 5 shows a flowchart illustrating the process of instantiating a pcell in an EDA application in accordance with an embodiment. In one or more embodiments, one or more of the steps may be omitted, repeated, and/or performed in a different order. Accordingly, the specific arrangement of steps shown in FIG. 5 should not be construed as limiting the scope of the embodiments.

Initially, an evaluation request for a pcell is transparently intercepted (operation 502). The evaluation request may include a set of parameter values that represents a variant of the pcell. In addition, the evaluation request may be processed based on the availability of an evaluation result corresponding to the evaluation request (operation 504). More specifically, the evaluation result for the variant may be found in a cache file for the pcell.

If the evaluation result is not available, the evaluation request is passed to an evaluator for the pcell (operation 508). The evaluator may correspond to a plug-in that executes source code for the pcell to generate a graphical representation of the pcell. For example, the evaluator may produce a graphical object corresponding to a transistor by executing source code for the transistor and using parameter values for the transistor's parameters as input arguments to the source code.

The evaluation result of the variant from the evaluator is then persisted across sessions of the EDA application by storing the evaluation result at a location in the cache file (operation 510). For example, the evaluation result may be written above existing evaluation results in the cache file. To enable use of the evaluation result in the cache file, the variant is mapped to the location in the cache file by serializing the parameter values for the variant into a unique symbol (operation 512) and mapping the unique symbol to an offset corresponding to the location in the cache file (operation 514).

If the evaluation result is available (e.g., the cache file contains the newest version of the evaluation result), the system can check whether one or more dependencies associated with the pcell are satisfied (operation 516). The dependencies may be associated with timestamps and/or file paths of source files and/or technology files used to evaluate the pcell. The dependencies may also be associated with an evaluation result of a dependency-checking expression for the pcell. As a result, the dependencies may ensure that evaluation results for variants in the cache file are valid and up-to-date. Note that the system can skip operation 516 if the pcells have been "frozen" to isolate the workflow from frequent changes in the set of dependencies. In other words, when the pcells are "frozen," the "YES" branch of operation 504 would directly lead to operation 506. If the dependencies are satisfied or if the pcells have been "frozen," the pcell is instantiated from the cache file (operation 506). If the dependencies are not satisfied and if the pcells have not been "frozen," the persisted evaluation results in the cache file are invalidated or discarded (operation 518) to prevent instantiation of the pcell from invalid evaluation results.

To persist the evaluation result across sessions of the EDA application, the mapping of the variant to the location may be stored in an index file that is written to non-volatile storage. For example, an entry within the index file that contains the variant's unique symbol may be updated with the offset of the evaluation result if the evaluation result replaces an older evaluation result for the variant in the cache file. On the other hand, if the evaluation result corresponds to the first evaluation result for the variant in the cache file, a new entry containing a mapping of the unique symbol to the evaluation result's location may be added to the index file.

Such processing of evaluation requests for the pcell may continue (operation 520) until the pcell is no longer used and/or caching of the evaluation results is disabled. Each evaluation request may be transparently intercepted (operation 502) and processed based on the availability of a corresponding evaluation result (operation 504) in the cache file. If the evaluation result is available, the pcell is instantiated from the cache file (operation 506). If the evaluation result is not available, the evaluation request is passed to an evaluator for the pcell (operation 508) for processing and stored for future use (operations 510-514). The cache file may also be discarded based at least on dependencies associated with the pcell (operations 516 and 518).

Instantiation of the pcell from cached evaluation results may thus improve performance in the EDA application by reducing the frequency with which the pcell is evaluated for instantiation. Persisting of the evaluation results across sessions of the EDA application may further reduce computational overhead by mitigating repeated evaluation of the pcell during the opening of designs containing the pcell. Moreover, dependency-based discarding of the persisted evaluation results may prevent the instantiation of the pcell from invalid evaluation results.

Figure 6:
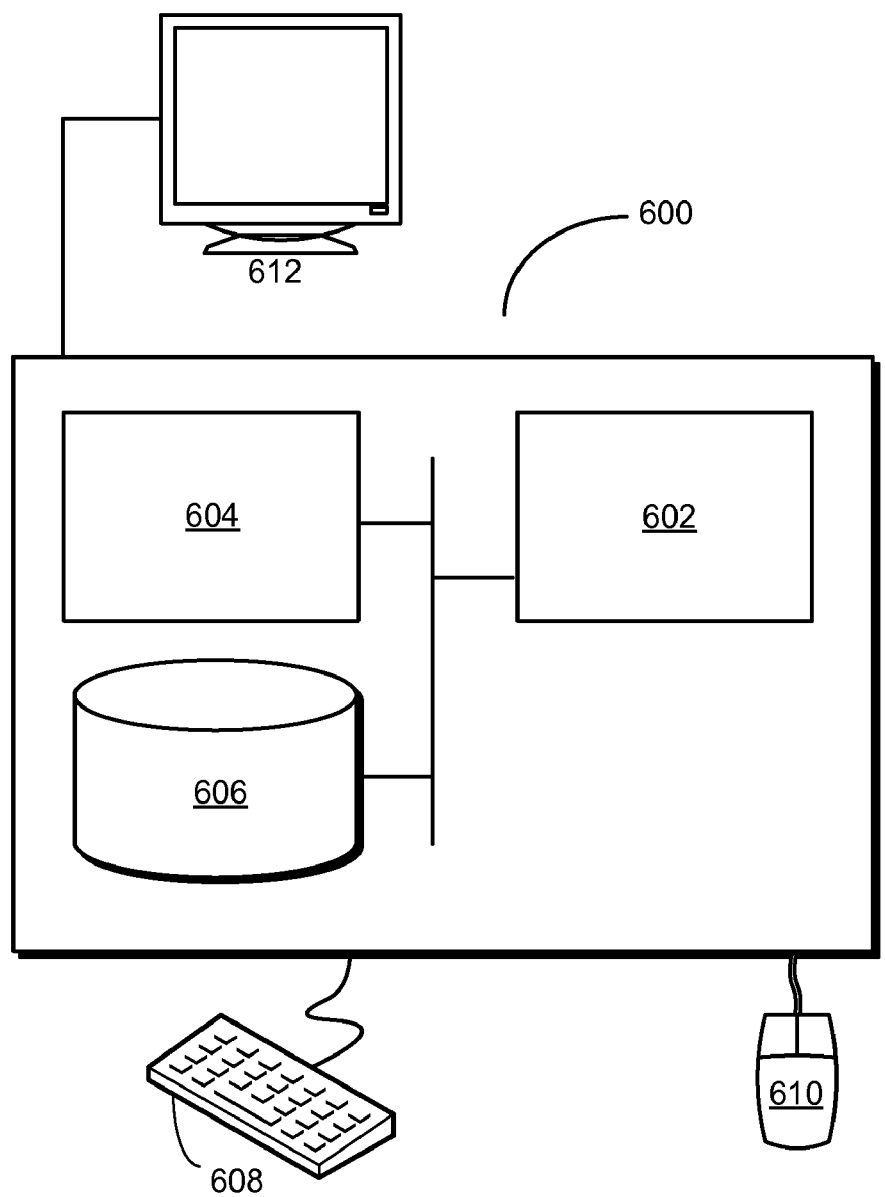
FIG. 6 shows a computer system in accordance with an embodiment.

FIG. 6 shows a computer system 600 in accordance with an embodiment. Computer system 600 includes a processor 602, memory 604, storage 606, and/or other components found in electronic computing devices. Processor 602 may support parallel processing and/or multi-threaded operation with other processors in computer system 600. Computer system 600 may also include input/output (I/O) devices such as a keyboard 608, a mouse 610, and a display 612. Note that the system configuration shown in FIG. 6 is for illustration purposes only and is not intended to limit the scope of the present invention.

Computer system 600 may include functionality to execute various components of the present embodiments. In particular, computer system 600 may include an operating system (not shown) that coordinates the use of hardware and software resources on computer system 600, as well as one or more applications that perform specialized tasks for the user. To perform tasks for the user, applications may obtain the use of hardware resources on computer system 600 from the operating system, as well as interact with the user through a hardware and/or software framework provided by the operating system.

In one or more embodiments, computer system 600 provides a system for facilitating the creation of a design within an EDA application. The system may include a caching apparatus that persists evaluation results associated with a pcell in the design across sessions of the EDA application and discards the persisted evaluation results based at least on a dependency associated with the pcell. The system may also include an interposing apparatus that uses the persisted evaluation results to instantiate the pcell without re-evaluating the pcell.

In addition, one or more components of computer system 600 may be remotely located and connected to the other components over a network. Portions of the present embodiments (e.g., caching apparatus, interposing apparatus, etc.) may also be located on different nodes of a distributed system that implements the embodiments. For example, the present embodiments may be implemented using a cloud computing system that enables the creation of designs on a remote EDA application.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for facilitating the creation of a design in an electronic design automation (EDA) application, comprising:
persisting evaluation results associated with a parameterized cell in the design across sessions of the EDA application, which involves storing an evaluation result of a variant of the parameterized cell at a location in a cache file, and mapping the variant to the location in the cache file;
using the persisted evaluation results to instantiate, by using one or more computers, the parameterized cell without re-evaluating the parameterized cell, which involves:
transparently intercepting an evaluation request for the parameterized cell, wherein transparent interception of the evaluation request is enabled by registering an interposing evaluator whose name is the same as the evaluator; and
in response to the evaluation request:
instantiating the parameterized cell from the cache file if the cache file contains an evaluation result corresponding to the evaluation request; and
if the evaluation result is not found in the cache file, passing the evaluation request to an evaluator for the parameterized cell, and storing evaluation results from the evaluator in the cache file; and
discarding the persisted evaluation results based at least on a dependency associated with the parameterized cell.

2. The computer-implemented method of claim 1, wherein mapping the variant to the location in the cache file involves:
serializing a set of parameter values for the variant into a unique symbol; and
mapping the unique symbol to an offset corresponding to the location in the cache file.

3. The computer-implemented method of claim 1, wherein the evaluation result of the variant is persisted across sessions of the EDA application by storing, in an index file, the mapping of the variant to the location in the cache file.

4. The computer-implemented method of claim 1, wherein the persisted evaluation results are further discarded based at least on a file size threshold associated with the cache file.

5. The computer-implemented method of claim 1, wherein the dependency is associated with at least one of a timestamp, a file path, and an evaluation result of a dependency-checking expression for the parameterized cell.

6. A system for facilitating the creation of a design in an electronic design automation (EDA) application, comprising:
a caching apparatus configured to:
persist evaluation results associated with a parameterized cell in the design across sessions of the EDA application, which involves storing an evaluation result of a variant of the parameterized cell at a location in a cache file, and mapping the variant to the location in the cache file; and
discard the persisted evaluation results based at least on a dependency associated with the parameterized cell; and
an interposing apparatus configured to use the persisted evaluation results to instantiate the parameterized cell without re-evaluating the parameterized cell, which involves:
transparently intercepting an evaluation request for the parameterized cell, wherein transparent interception of the evaluation request is enabled by registering an interposing evaluator whose name is the same as the evaluator; and
in response to the evaluation request:
instantiating the parameterized cell from the cache file if the cache file contains an evaluation result corresponding to the evaluation request; and
if the evaluation result is not found in the cache file, passing the evaluation request to an evaluator for the parameterized cell, and storing evaluation results from the evaluator in the cache file.

7. The system of claim 6, wherein mapping the variant to the location in the cache file involves:
serializing a set of parameter values for the variant into a unique symbol; and
mapping the unique symbol to an offset corresponding to the location in the cache file.

8. The system of claim 6, wherein the evaluation result of the variant is persisted across sessions of the EDA application by storing, in an index file, the mapping of the variant to the location in the cache file.

9. The system of claim 6, wherein the persisted evaluation results are further discarded based at least on a file size threshold associated with the cache file.

10. The system of claim 6, wherein the dependency is associated with at least one of a timestamp, a file path, and an evaluation result of a dependency-checking expression for the parameterized cell.

11. A non-transitory computer-readable storage medium storing instructions that when executed by a computer cause the computer to perform a method for facilitating the creation of a design in an electronic design automation (EDA) application, the method comprising:

persisting evaluation results associated with a parameterized cell in the design across sessions of the EDA application, which involves storing an evaluation result of a variant of the parameterized cell at a location in a cache file, and mapping the variant to the location in the cache file;

using the persisted evaluation results to instantiate the parameterized cell without re-evaluating the parameterized cell, which involves:

transparently intercepting an evaluation request for the parameterized cell, wherein transparent interception of the evaluation request is enabled by registering an interposing evaluator whose name is the same as the evaluator; and in response to the evaluation request:

instantiating the parameterized cell from the cache file if the cache file contains an evaluation result corresponding to the evaluation request; and if the evaluation result is not found in the cache file, passing the evaluation request to an evaluator for the parameterized cell, and storing evaluation results from the evaluator in the cache file; and discarding the persisted evaluation results based at least on a dependency associated with the parameterized cell.

12. The computer-readable storage medium of claim 11, wherein mapping the variant to the location in the cache file involves:

serializing a set of parameter values for the variant into a unique symbol;
and
mapping the unique symbol to an offset corresponding to the location in the cache file.

13. The computer-readable storage medium of claim 11, wherein the evaluation result of the variant is persisted across sessions of the EDA application by storing, in an index file, the mapping of the variant to the location in cache file.

14. The computer-readable storage medium of claim 11, wherein the persisted evaluation results are further discarded based at least on a file size threshold associated with the cache file.

15. The computer-readable storage medium of claim 11, wherein the dependency is associated with at least one of a timestamp, a file path, and an evaluation result of a dependency-checking expression for the parameterized cell.

16. A method for facilitating the creation of a design in an electronic design automation (EDA) application, comprising:

registering, using a computer, an interposing evaluator whose name is the same as an evaluator for a parameterized cell;

the interposing evaluator transparently intercepting an evaluation request for the parameterized cell;

if a cache file contains an evaluation result corresponding to the evaluation request, the interposing evaluator instantiating the parameterized cell from the cache file; and if the cache file does not contain the evaluation result corresponding to the evaluation request, the interposing evaluator passing the evaluation request to an evaluator for the parameterized cell, and the interposing evaluator storing evaluation results from the evaluator in the cache file.

\* \* \* \* \*